US012620951B2

(12) United States Patent　　　　(10) Patent No.:　US 12,620,951 B2
Ashida　　　　　　　　　　　　　(45) Date of Patent:　　　　　May 5, 2026

(54) RADIO-FREQUENCY MODULE

(71) Applicant: Murata Manufacturing Co., Ltd., Nagaokakyo (JP)

(72) Inventor: Tetsurou Ashida, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 307 days.

(21) Appl. No.: 18/489,860

(22) Filed: Oct. 19, 2023

(65) Prior Publication Data

US 2024/0072741 A1　　Feb. 29, 2024

Related U.S. Application Data

(63) Continuation of application No. PCT/JP2022/019341, filed on Apr. 28, 2022.

(30) Foreign Application Priority Data

Apr. 28, 2021　(JP) ................................. 2021-076094

(51) Int. Cl.
　　*H04L 5/14*　　　(2006.01)
　　*H03F 3/24*　　　(2006.01)
(52) U.S. Cl.
　　CPC ........... *H03F 3/245* (2013.01); *H04L 5/1469* (2013.01); *H03F 2200/165* (2013.01); *H03F 2200/171* (2013.01); *H03F 2200/451* (2013.01)
(58) Field of Classification Search
　　CPC .............. H03F 3/245; H03F 2200/165; H03F 2200/171; H03F 2200/451; H04L 5/1469
　　USPC ........................................................ 370/280
　　See application file for complete search history.

(56) References Cited

U.S. PATENT DOCUMENTS

| | | |
|---|---|---|
| 2014/0307836 A1 | 10/2014 | Khlat |
| 2015/0133067 A1 | 5/2015 | Chang et al. |
| 2016/0006556 A1 | 1/2016 | Pehlke et al. |
| 2018/0019768 A1* | 1/2018 | King .................. H04L 27/0002 |

(Continued)

FOREIGN PATENT DOCUMENTS

| | | | | |
|---|---|---|---|---|
| CN | 215912093 U | * | 2/2022 | ............... H04B 1/50 |
| JP | 2004-015162 A | | 1/2004 | |

(Continued)

OTHER PUBLICATIONS

International Search Report and Written Opinion mailed on Jul. 26, 2022, received for PCT Application PCT/JP2022/019341, filed on Apr. 28, 2022, 9 pages including English Translation.

(Continued)

*Primary Examiner* — Ayman A Abaza
(74) *Attorney, Agent, or Firm* — XSENSUS LLP

(57) ABSTRACT

A smaller size is achieved by reducing a circuit size and the characteristics of all bands are made satisfactory. A radio-frequency module transmits and receives transmission/reception signals in a first frequency band and transmission/reception signals in a second frequency band lower than the first frequency band by time division duplex communication. A switch allows an output from a filter to be input to a low-noise amplifier upon reception of a signal in the second frequency band and allows an output from a power amplifier to be input to the filter upon transmission of a signal in the second frequency band to thereby share the filter for transmission/reception signals in the second frequency band.

21 Claims, 11 Drawing Sheets

(56) References Cited

U.S. PATENT DOCUMENTS

| | | | |
|---|---|---|---|
| 2019/0273519 A1* | 9/2019 | Shinozaki | ............... H04B 1/48 |
| 2019/0312336 A1 | 10/2019 | Son et al. | |
| 2020/0343930 A1 | 10/2020 | DiTommaso et al. | |

FOREIGN PATENT DOCUMENTS

| | | | |
|---|---|---|---|
| JP | 2019-528656 A | 10/2019 | |
| WO | 2020/153285 A1 | 7/2020 | |
| WO | 2021/002454 A1 | 1/2021 | |
| WO | WO-2023158714 A1 * | 8/2023 | .............. H03H 9/58 |

OTHER PUBLICATIONS

Office Action issued on Jan. 13, 2026, in corresponding Chinese patent Application No. 202280029204.0, 8 pages.

* cited by examiner

RADIO-FREQUENCY MODULE

CROSS-REFERENCE TO RELATED APPLICATIONS

This is a continuation application of PCT/JP2022/019341, filed on Apr. 28, 2022, designating the United States of America, which is based on and claims priority to Japanese Patent Application No. JP 2021-076094 filed on Apr. 28, 2021. The entire contents of the above-identified applications, including the specifications, drawings and claims, are incorporated herein by reference in their entirety.

TECHNICAL FIELD

The present disclosure relates to a radio-frequency module.

BACKGROUND ART

A radio-frequency module for realizing a radio-frequency signal transmitting/receiving circuit is used in wireless devices such as mobile phones. A radio-frequency module of this type may be called an RF front-end module. A configuration in which different multiplex modes are realized by a single radio-frequency module is known (for example, Patent Document 1 and Patent Document 2). A radio-frequency module disclosed in Patent Document 1 realizes Frequency Division Duplex (FDD) communication and Time Division Duplex (TDD) communication. A radio-frequency module disclosed in Patent Document 2 realizes Time Division Multiple Access (TDMA) communication and Code Division Multiple Access (CDMA) communication.

CITATION LIST

Patent Documents

Patent Document 1: International Publication No. 2020/153285
Patent Document 2: Japanese Unexamined Patent Application Publication No. 2004-015162

SUMMARY OF DISCLOSURE

Technical Problem

With the widespread use of the fifth generation mobile communication system, a demand for implementing a configuration for realizing a plurality of bands, including a UHF (Ultra-High Frequency) band, corresponding to time division duplex communication in a single radio-frequency module is expected to increase. In a case of realizing a plurality of bands corresponding to time division duplex communication, an attempt to optimize the frequency characteristics of all of the plurality of bands causes an increase in the circuit size but the increase is not preferable. Meanwhile, there is an increasing demand for making the module smaller in order to improve the degree of integration of components for increased functionality of mobile phones and so on. Therefore, it is preferable to achieve both of optimization of the frequency characteristics of the radio-frequency module and space saving of the radio-frequency module.

The present disclosure has been made in view of the above and an object thereof is to provide a radio-frequency module having a configuration in which a plurality of bands corresponding to time division duplex communication are realized with a circuit configuration that can achieve a smaller size by reducing the circuit size and can make the characteristics of all of the bands satisfactory.

Solution to Problem

To address the above-described issue and to achieve the object, a radio-frequency module according to an aspect of the present disclosure includes: a substrate on which a first input terminal to which a first transmission signal in a first frequency band is input; a second input terminal to which a second transmission signal in a second frequency band lower than the first frequency band is input; a first transmission amplifier unit that amplifies the first transmission signal input to the first input terminal; a first filter that allows an output from the first transmission amplifier unit to pass therethrough; a second filter that allows a first reception signal in the first frequency band to pass therethrough; a third filter that allows a second reception signal in the second frequency band and the second transmission signal in the second frequency band to pass therethrough; a first reception amplifier unit that amplifies an output from the second filter; a second reception amplifier unit that amplifies an output from the third filter; a second transmission amplifier unit that amplifies the second transmission signal input to the second input terminal; a first switch and a second switch; a first output terminal from which an output from the first reception amplifier unit is output; and a second output terminal from which an output from the second reception amplifier unit is output are mounted, in which upon transmission in time division duplex communication, the radio-frequency module transmits at least one of the first transmission signal or the second transmission signal, upon reception in time division duplex communication, the radio-frequency module receives at least one of the first reception signal or the second reception signal, the first switch allows the output from the third filter to be input to the second reception amplifier unit upon reception in time division duplex communication, and allows an output from the second transmission amplifier unit to be input to the third filter upon transmission in time division duplex communication, and the second switch is in at least one of a state in which the second switch allows a reception signal from a first antenna to be input to the first reception amplifier unit via the second filter or a state in which the second switch allows a reception signal from a second antenna to be input to the second reception amplifier unit via the third filter upon reception in time division duplex communication, and is in at least one of a state in which the second switch allows an output from the first filter to be output to the first antenna or a state in which the second switch allows an output from the third filter to be output to the second antenna upon transmission in time division duplex communication.

Advantageous Effects of Disclosure

The radio-frequency module according to the present disclosure can realize a circuit configuration that can achieve a smaller size by reducing the circuit size and can make the characteristics of all of the bands satisfactory.

DESCRIPTION OF EMBODIMENTS

Figure 1:
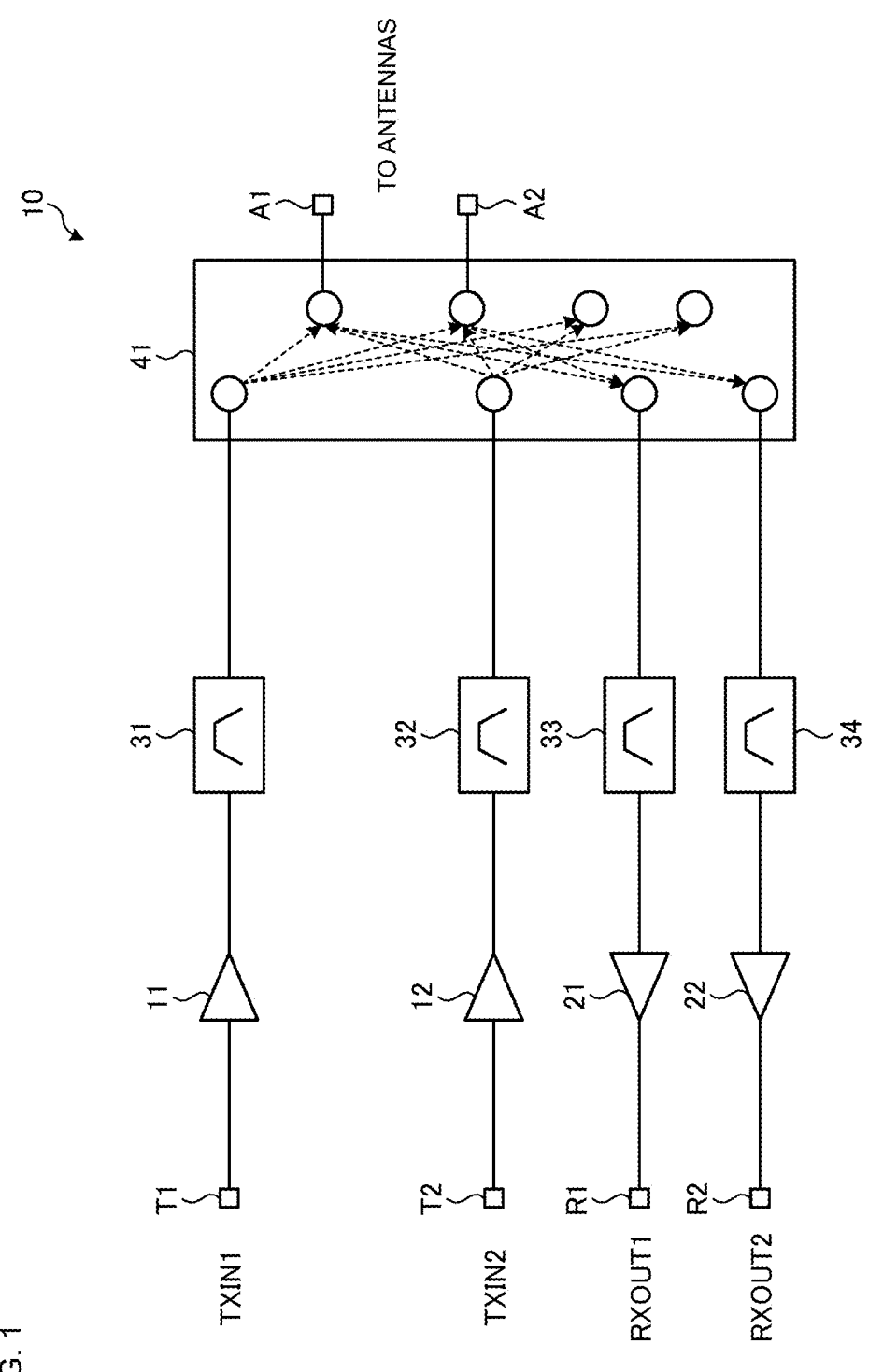
FIG. 1 is a diagram illustrating an example radio-frequency signal transmitting/receiving circuit.

Hereinafter, embodiments of the present disclosure will be described in detail with reference to the drawings. In the following description of each embodiment, a constituent part the same as or equivalent to that in another embodiment is assigned the same reference numeral and a description thereof will be briefly given or omitted. Each embodiment is not intended to limit the present disclosure. Constituent elements in each embodiment include those that are replaceable by a person skilled in the art and are simple or that are substantially the same. Note that configurations described below can be combined as appropriate. Further, a configuration can be omitted, replaced, or changed without departing from the gist of the present disclosure.

COMPARATIVE EXAMPLES

To facilitate understanding of the radio-frequency module of the present disclosure, comparative examples will be first described. FIG. 1 is a diagram illustrating an example radio-frequency signal transmitting/receiving circuit. A radio-frequency signal transmitting/receiving circuit 10 illustrated in FIG. 1 includes power amplifiers (PAs) 11 and 12, filters 31, 32, 33, and 34, low-noise amplifiers 21 and 22, and a switch 41. The radio-frequency signal transmitting/receiving circuit 10 further includes input terminals T1 and T2, output terminals R1 and R2, and antenna terminals A1 and A2.

The power amplifier 11 amplifies a radio-frequency signal input to the input terminal T1. The power amplifier 12 amplifies a radio-frequency signal input to the input terminal T2. The power amplifiers 11 and 12 may amplify an SRS (Sounding Reference Signal) signal.

The low-noise amplifier 21 amplifies and outputs to the output terminal R1, a received radio-frequency signal. The low-noise amplifier 22 amplifies and outputs to the output terminal R2, a received radio-frequency signal.

The filters 31, 32, 33, and 34 allow a signal having a specific frequency to pass therethrough. The filters 31, 32, 33, and 34 are, for example, band-pass filters (BPFs).

The radio-frequency signal transmitting/receiving circuit 10 includes a transmission path that goes through the power amplifier 11 and a transmission path that goes through the power amplifier 12. The radio-frequency signal transmitting/receiving circuit 10 includes a reception path that goes through the low-noise amplifier 21 and a reception path that goes through the low-noise amplifier 22. The power amplifier 11 and the filter 31 constitute a part of one of the transmission paths. The power amplifier 12 and the filter 32 constitute a part of the other transmission path. The filter 33 and the low-noise amplifier 21 constitute a part of one of the reception paths. The filter 34 and the low-noise amplifier 22 constitute a part of the other reception path. To perform time division duplex communication, the switch 41 selectively connects the two transmission paths and the two reception paths to the antenna terminals A1 and A2. Accordingly, the two transmission paths or the two reception paths are electrically connected to two antennas (not illustrated).

As illustrated in FIG. 1, when the filters 31 to 34 are provided for the respective amplifiers, namely, the power amplifiers 11 and 12 and the low-noise amplifiers 21 and 22, on a one-to-one basis, the circuit size increases. To make the circuit size small, the number of filters may be decreased. For example, in FIG. 1, a switch may be provided on a path so as to allow switching between paths and the same filter may be used in transmission and reception. Accordingly, a part of a transmission path and a part of a reception path can be integrated and the number of filters can be decreased.

Figure 2:
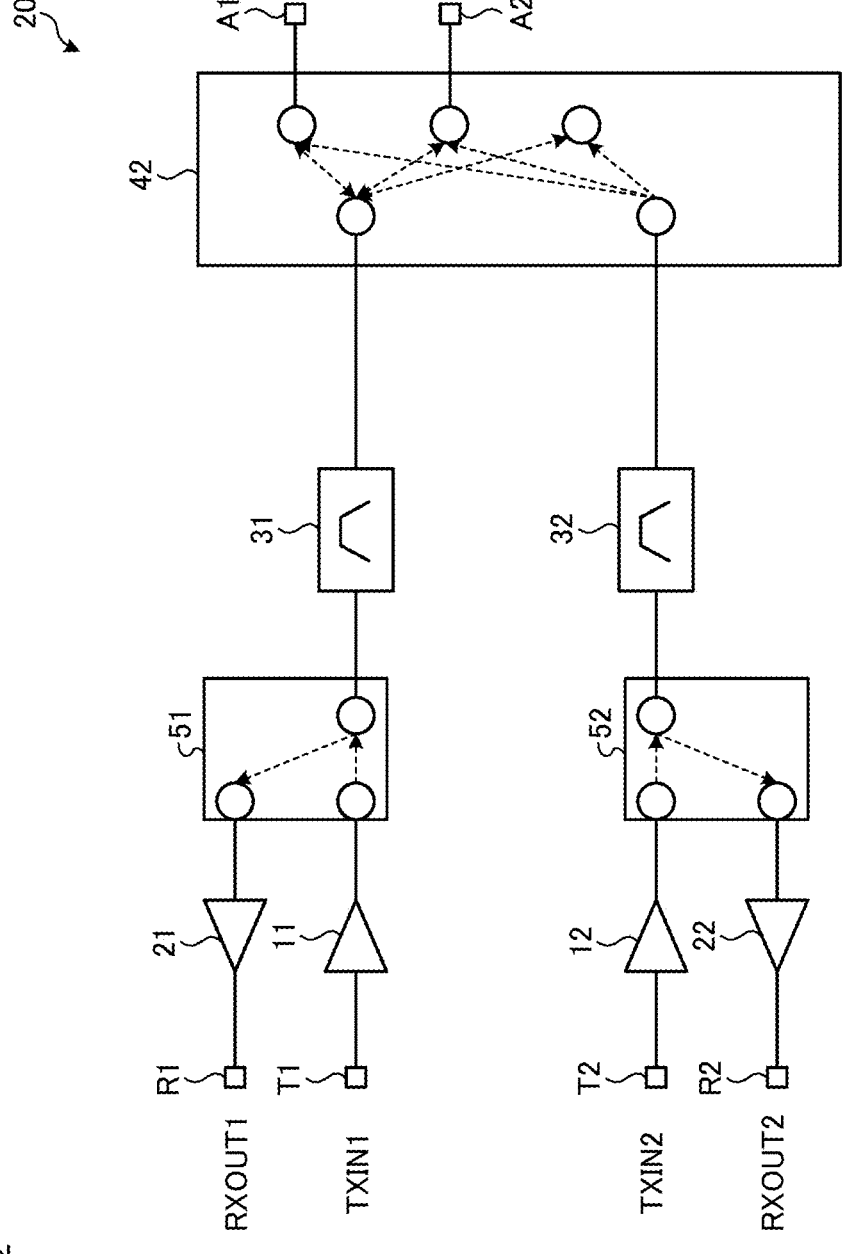
FIG. 2 is a diagram illustrating an example radio-frequency signal transmitting/receiving circuit in which switches are provided on paths.

FIG. 2 is a diagram illustrating an example of a radio-frequency signal transmitting/receiving circuit 20 in which switches are provided on paths. The radio-frequency signal transmitting/receiving circuit 20 illustrated in FIG. 2 includes switches 51 and 52. The switches 51 and 52 each electrically connect one of two paths with one path. That is, to perform time division duplex communication, each switch connects a path for a transmission signal to an antenna upon transmission and connects a path for a reception signal to an antenna upon reception.

The switch 51 allows selection of one of the power amplifier 11 and the low-noise amplifier 21. The switch 51 electrically connects the power amplifier 11, which is a part of a transmission path, and the low-noise amplifier 21, which is a part of a reception path, to the filter 31 selectively. The filter 31 is a part of the transmission path and a part of the reception path. Accordingly, the filter 31 is shared between the transmission path and the reception path. That is, a part of the transmission path and a part of the reception path are integrated.

The switch 52 allows selection of one of the power amplifier 12 and the low-noise amplifier 22. The switch 52 electrically connects the power amplifier 12, which is a part of a transmission path, and the low-noise amplifier 22, which is a part of a reception path, to the filter 32 selectively. The filter 32 is a part of the transmission path and a part of the reception path. Accordingly, the filter 32 is shared between the transmission path and the reception path. That is, a part of the transmission path and a part of the reception path are integrated.

The radio-frequency signal transmitting/receiving circuit 20 further includes a switch 42. The switch 42 electrically connects the path that goes through the filter 31 and the path that goes through the filter 32 to two antennas (not illustrated) selectively.

In the radio-frequency signal transmitting/receiving circuit 20 illustrated in FIG. 2, the switches 51 and 52 are added to thereby integrate a part of each transmission path and a part of a corresponding reception path. Therefore, the number of filters is smaller in the radio-frequency signal transmitting/receiving circuit 20 illustrated in FIG. 2 than in the case of FIG. 1. Regarding mounting on a substrate, generally, a switch can be mounted in a space smaller than that for a filter. Therefore, with the radio-frequency signal transmitting/receiving circuit 20, the entire module can be made smaller than with the radio-frequency signal transmitting/receiving circuit 10 illustrated in FIG. 1. However, addition of the switches 51 and 52 causes a loss.

Figure 3:
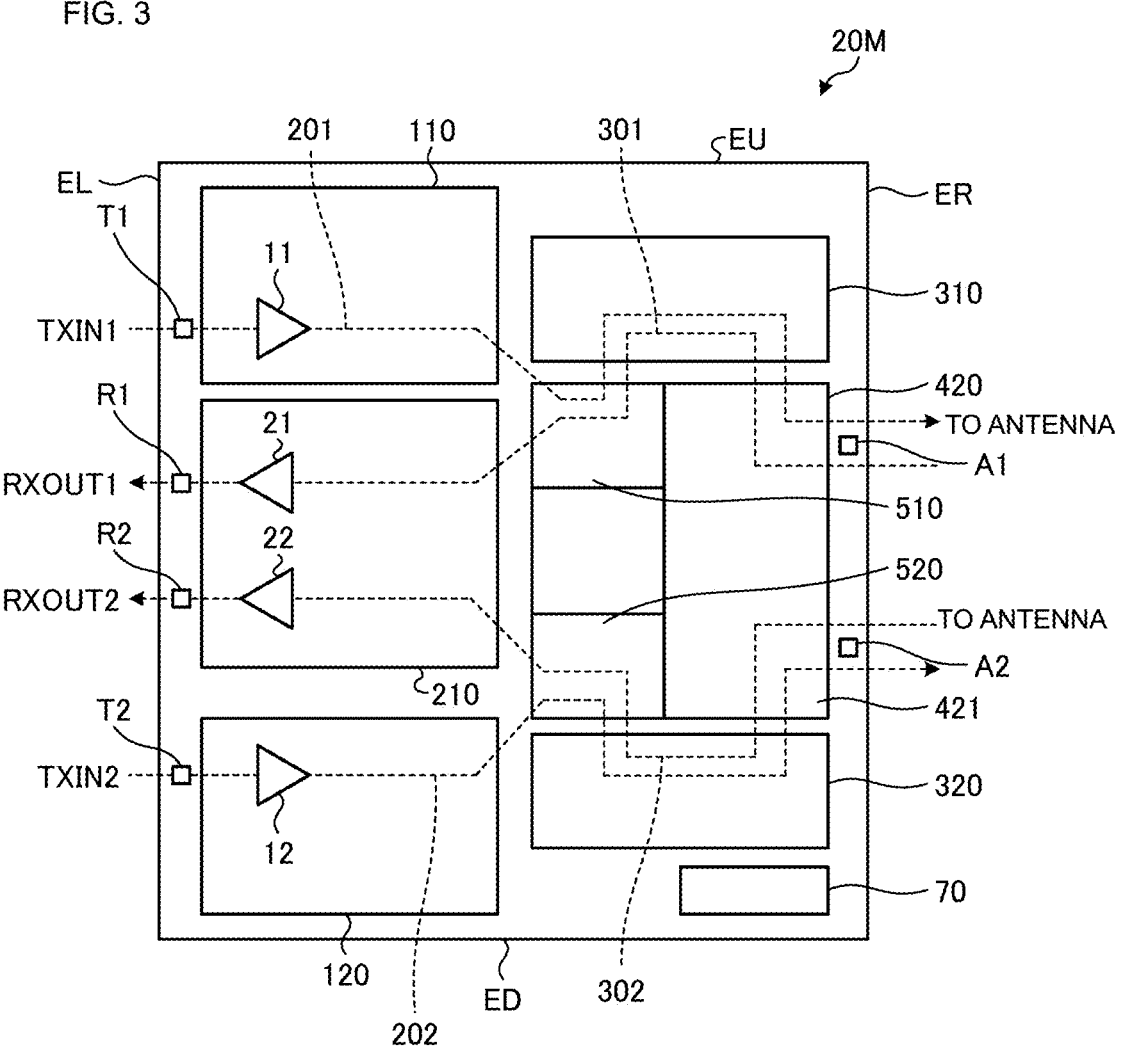
FIG. 3 is a diagram illustrating an example arrangement of a radio-frequency module for realizing the radio-frequency signal transmitting/receiving circuit illustrated in FIG. 2.

FIG. 3 is a diagram illustrating an example arrangement of a radio-frequency module 20M for realizing the radio-frequency signal transmitting/receiving circuit 20 illustrated in FIG. 2. In FIG. 3, the radio-frequency module 20M has regions 110, 120, 210, 310, 320, and 420. The region 420 includes regions 421, 510, and 520. The region 110 is a region in which the power amplifier 11 is disposed. In proximity to the region 110, the input terminal T1 to which a transmission signal TXIN1 is input is disposed. The region 120 is a region in which the power amplifier 12 is disposed. In proximity to the region 120, the input terminal T2 to which a transmission signal TXIN2 is input is disposed.

The region 210 is a region in which the low-noise amplifiers 21 and 22 are disposed. In proximity to the region 210, the output terminal R1 from which a reception signal RXOUT1 is output and the output terminal R2 from which a reception signal RXOUT2 is output are disposed. The region 310 is a region in which the filter 31 is disposed. The region 320 is a region in which the filter 32 is disposed. The region 421 is a region in which the switch 42 is disposed. The region 510 is a region in which the switch 51 is disposed. The region 520 is a region in which the switch 52 is disposed. In proximity to the region 421, the antenna terminals A1 and A2 that are electrically connected to antennas not illustrated are disposed.

Note that the radio-frequency module 20M has a region 70 in which a power amplifier controller (PAC) is included. The power amplifier controller controls the power amplifiers 11 and 12.

In FIG. 3, the radio-frequency module 20M has an upper edge EU that is positioned on the upper side of FIG. 3, a lower edge ED that is positioned on the lower side thereof, a left-hand edge EL that is positioned on the left side thereof, and a right-hand edge ER that is positioned on the right side thereof.

In FIG. 3, a path 201 that extends from the left-hand edge EL to the right-hand edge ER via the region 110, the region 510, the region 310, and the region 420 and reaches an antenna not illustrated is a transmission path. A path 202 that extends from the left-hand edge EL to the right-hand edge ER via the region 120, the region 520, the region 320, and the region 420 and reaches an antenna not illustrated is another transmission path.

A path 301 that extends from an antenna not illustrated, goes through the right-hand edge ER, and extends to the left-hand edge EL via the region 420, the region 310, the region 510, and the region 210 is a reception path. A path 302 that extends from an antenna not illustrated, goes through the right-hand edge ER, and extends to the left-hand edge EL via the region 420, the region 320, the region 520, and the region 210 is another reception path.

That is, in the radio-frequency module 20M illustrated in FIG. 3, the antenna terminals A1 and A2 connected to the antennas are disposed adjacent to the right-hand edge ER, and the input terminals T1 and T2 to which transmission signals are input and the output terminals R1 and R2 from which reception signals are output are disposed adjacent to the left-hand edge EL. Accordingly, wiring lines can be laid without the paths crossing each other.

Figure 4:
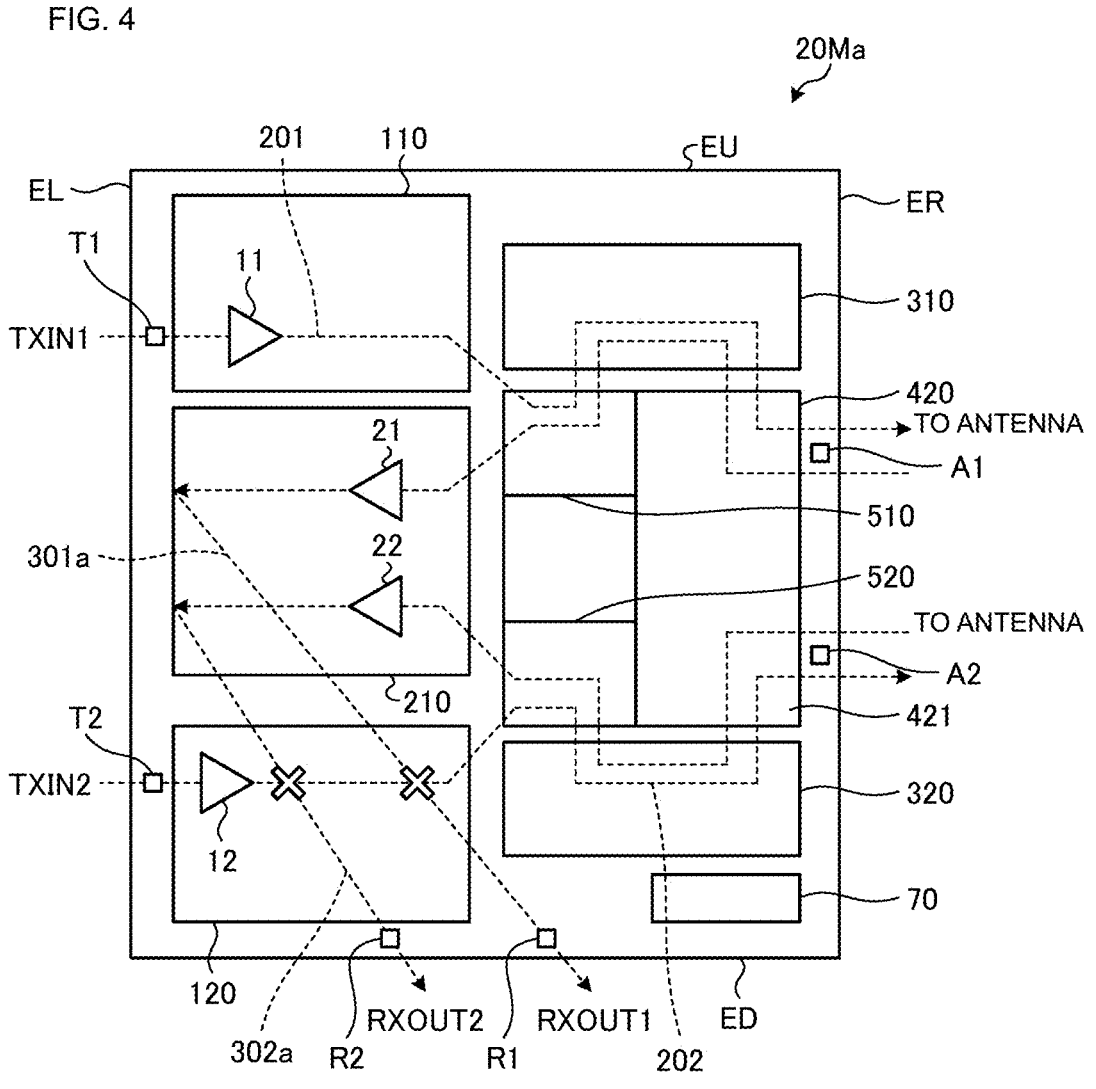
FIG. 4 is a diagram illustrating an example arrangement of another radio-frequency module.

Depending on the positions of the terminals, paths may cross each other. FIG. 4 is a diagram illustrating an example arrangement of another radio-frequency module 20Ma. The radio-frequency module 20Ma has functions the same as those of the radio-frequency module 20M illustrated in FIG. 3 but the arrangement of the terminals is different. That is, in the example illustrated in FIG. 4, the input terminals T1 and T2 to which the transmission signals TXIN1 and TXIN2 are input are disposed adjacent to the left-hand edge EL while the output terminals R1 and R2 from which the reception signals RXOUT1 and RXOUT2 are output are disposed adjacent to the lower edge ED. In this arrangement, paths cross each other as indicated by x marks in FIG. 4. That is, the path 202, which is a transmission path, and a path 301a, which is a reception path, cross each other. The path 202, which is a transmission path, and a path 302a, which is a reception path, cross each other. Further, the length of wiring lines included in the paths increases, which is not preferable. When paths cross each other or the length of wiring lines increases, design work for a substrate for realizing the radio-frequency module is limited or a space necessary for mounting increases, which may make the design work difficult. An increase in the number of paths for corresponding to a larger number of bands is expected in the future. As the number of paths increases, there is a possibility that arrangement of components without paths crossing each other becomes difficult.

First Embodiment

Figure 5:
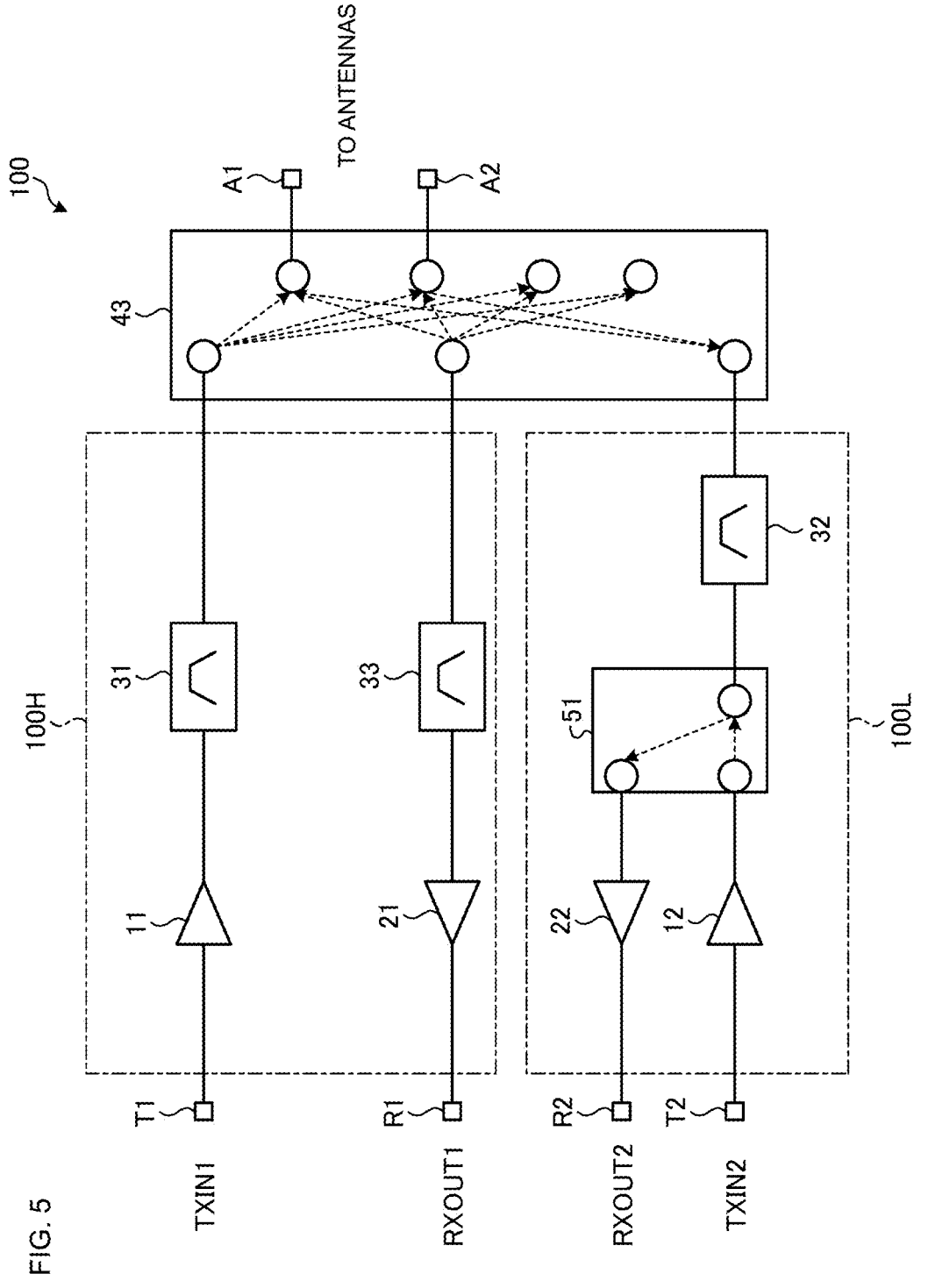
FIG. 5 is a diagram illustrating a radio-frequency signal transmitting/receiving circuit mounted in a radio-frequency module according to a first embodiment of the present disclosure.

FIG. 5 is a diagram illustrating a radio-frequency signal transmitting/receiving circuit 100 mounted in a radio-frequency module according to a first embodiment of the present disclosure. As illustrated in FIG. 5, the radio-frequency signal transmitting/receiving circuit 100 includes a high-band unit 100H for transmitting and receiving signals in a relatively high frequency band (hereinafter referred to as a first frequency band) and a low-band unit 100L for transmitting and receiving signals in a relatively low frequency band (hereinafter referred to as a second frequency band). The second frequency band is lower than the first frequency band. The radio-frequency signal transmitting/receiving circuit 100 further includes a switch 43 for connecting paths in the high-band unit 100H and the low-band unit 100L to a first antenna or a second antenna not illustrated. The switch 43 is in at least one of a state in which a reception signal from the first antenna is input to the first reception amplifier unit 21 via the filter 33 or a state in which a reception signal from the second antenna is input to the second reception amplifier unit 22 via the filter 32 upon reception in time division duplex communication. Here, the first reception amplifier unit 21 or the second reception amplifier unit 22 may be a low noise amplifier. The switch 43 is in at least one of a state in which an output from the filter 31 is output to the first antenna or a state in which an output from the filter 32 is output to the second antenna upon transmission in time division duplex communication.

The low-band unit 100L includes the power amplifier 12, the low-noise amplifier 22, the filter 32, and the switch 51. The power amplifier 12 amplifies the transmission signal TXIN2 input to the input terminal T2. The power amplifier 12 corresponds to a second transmission amplifier unit of the present disclosure. The transmission signal TXIN2 corresponds to a second transmission signal of the present disclosure. The low-noise amplifier 22 amplifies an output from the filter 32. The low-noise amplifier 22 corresponds to a second reception amplifier unit of the present disclosure. The filter 32 allows a second reception signal (RXOUT2) in the second frequency band and the second transmission signal (TXIN2) in the second frequency band to pass therethrough. The filter 32 corresponds to a third filter of the present disclosure.

The switch 51 is a switch for switching between paths and sharing the filter 32. The frequency of a signal in the second frequency band is lower than that of a signal in the first frequency band, and therefore, a loss caused by the signal in the second frequency band passing through the switch 51 is small. Sharing of the filter 32 can reduce the number of components mounted in the module and make the module small. The switch 51 corresponds to a first switch of the present disclosure.

The high-band unit 100H includes the power amplifier 11, the low-noise amplifier 21, and the filters 31 and 33. The power amplifier 11 amplifies the transmission signal TXIN1 input to the input terminal T1. The power amplifier 11 corresponds to a first transmission amplifier unit of the present disclosure. The transmission signal TXIN1 corresponds to a first transmission signal of the present disclosure. The low-noise amplifier 21 amplifies an output from the filter 33. The low-noise amplifier 21 corresponds to a first reception amplifier unit of the present disclosure. The filter 31 allows an output from the power amplifier 11 to pass therethrough. The filter 31 corresponds to a first filter of the present disclosure. The filter 33 allows a first reception signal (RXOUT1) in the first frequency band to pass therethrough. The filter 33 corresponds to a second filter of the present disclosure.

The radio-frequency signal transmitting/receiving circuit 100 transmits and receives transmission/reception signals in the first frequency band and transmission/reception signals in the second frequency band lower than the first frequency band by time division duplex communication. Upon transmission in time division duplex communication, the radio-frequency signal transmitting/receiving circuit 100 transmits at least one of a transmission signal in the first frequency band or a transmission signal in the second frequency band. Upon reception in time division duplex communication, the radio-frequency signal transmitting/receiving circuit 100 receives at least one of a reception signal in the first frequency band or a reception signal in the second frequency band. Upon reception of a reception signal in the second frequency band, the switch 51 allows an output from the filter 32 to be input to the low-noise amplifier 22. Upon transmission of a transmission signal in the second frequency band, the switch 51 allows an output from the power amplifier 12 to be input to the filter 32. With this switching by the switch 51, the filter 32 is shared for transmission/reception signals in the second frequency band. For transmission/reception signals in the second frequency band in which frequencies are lower than those in the first frequency band, a loss caused by the switch 51 is small.

For transmission/reception signals in the first frequency band, a filter is not shared. For a signal in the first frequency band, a loss caused by the signal passing through a switch is large unlike a signal in the second frequency band. Accordingly, the high-band unit 100H does not include a switch for switching between paths and sharing a filter. For transmission/reception signals in the first frequency band, dedicated filters are provided, which can improve frequency characteristics for the first frequency band.

As described with reference to FIG. 1, when a filter is provided for each individual transmission path and each individual reception path, the circuit size increases. In the first embodiment, to realize multiple bands, a switch is provided in the low-band unit 100L in which a loss caused by the switch, when provided, is small, and a switch is not provided in the high-band unit 100H.

That is, in the high-band unit 100H, a switch is not provided and a dedicated filter is provided for each of the transmission path and the reception path. In contrast, in the low-band unit 100L, a loss caused by a switch, when provided, is small, and therefore, a common filter is provided for the transmission path and the reception path, and the switch is used to switch between the paths. This can decrease the number of filters and prevent the occurrence of a loss caused by a switch, when provided.

Accordingly, the mounting space can be made small. Further, the characteristics of higher frequencies can be kept high, and therefore, the frequency characteristics of the entire radio-frequency module can be optimized and the radio-frequency module can be made small. That is, optimization of the frequency characteristics of the radio-frequency module and space saving of the radio-frequency module can be achieved.

Figure 6:
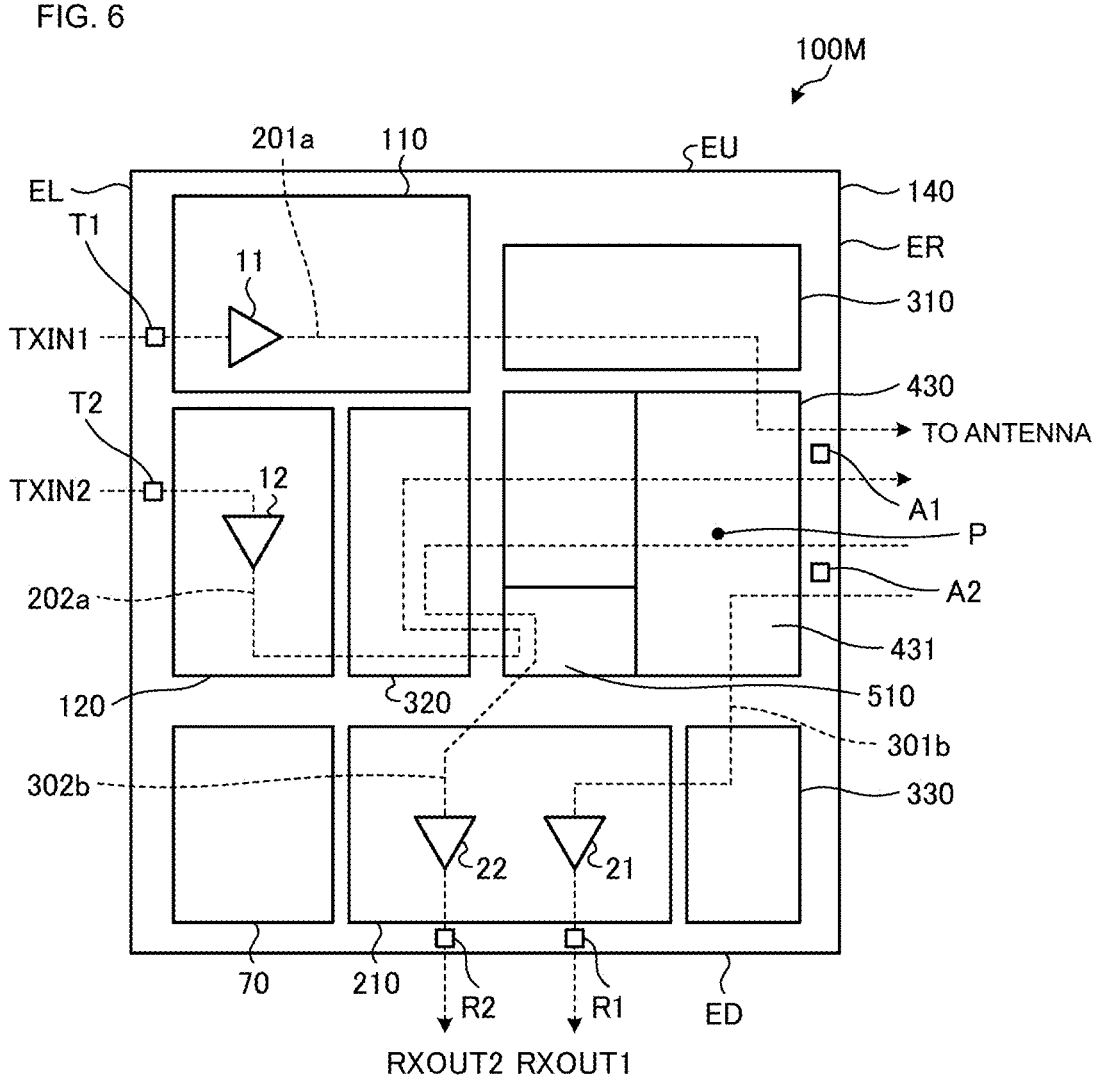
FIG. 6 is a diagram illustrating an example arrangement of the radio-frequency module in which the radio-frequency signal transmitting/receiving circuit illustrated in FIG. 5 is mounted.

FIG. 6 is a diagram illustrating an example arrangement of a radio-frequency module 100M in which the radio-frequency signal transmitting/receiving circuit 100 illustrated in FIG. 5 is mounted. In FIG. 6, the radio-frequency module 100M has the regions 110, 120, 210, 310, 320, 330, and 430 provided on a substrate 140. In the region 310, the filter 31 is included. In the region 320, the filter 32 is included. In the region 330, the filter 33 is included. The region 430 includes a region 431 and the region 510. In the region 431, the switch 43 illustrated in FIG. 5 is included. The antenna terminals A1 and A2 electrically connected to antennas not illustrated are provided in proximity to the region 431 and in proximity to the right-hand edge ER. The antenna terminal A1 corresponds to a first antenna terminal of the present disclosure. The antenna terminal A2 corresponds to a second antenna terminal of the present disclosure. Note that the antenna terminals A1 and A2 may be provided on the back side of the substrate 140 at positions opposite to the position of the region 431 provided on a main surface.

In the region 431, electrode pads (not illustrated) electrically connected to the antenna terminals A1 and A2 respectively are included. Preferably, these electrode pads are provided in the region 431 in proximity to the antenna terminals A1 and A2. Preferably, the electrode pads are provided at positions closer to the antenna terminals A1 and A2 than a center P of the region 430.

In the region 510, the switch 51 illustrated in FIG. 5 is provided. The switch 51 in the region 510 allows an output from the filter 32 in the region 320 to be input to the low-noise amplifier 22 upon reception in time division duplex communication. The switch 51 allows an output from the power amplifier 12 to be input to the filter 32 in the region 320 upon transmission in time division duplex communication.

In the region 510, electrode pads (not illustrated) electrically connected to the input terminal T2 and the output terminal R2 respectively are included. Preferably, these electrode pads are provided in the region 510 at positions as close to the input terminal T2 and the output terminal R2 as possible. With the arrangement as described above, wiring lines can be laid without the paths shown in dashed lines in FIG. 6 crossing each other.

The substrate 140 corresponds to a substrate of the present disclosure. On the main surface of the substrate 140, the input terminal T1, the input terminal T2, the antenna terminal A1, the antenna terminal A2, the output terminal R1, and the output terminal R2 are mounted. In plan view, the main surface of the substrate 140 has four edges. The main surface of the substrate 140 has the upper edge EU, the lower edge ED, the left-hand edge EL, and the right-hand edge ER. The upper edge EU and the lower edge ED are at positions opposite to each other. The left-hand edge EL and the right-hand edge ER are at positions opposite to each other. The right-hand edge ER corresponds to a first edge of the present disclosure. The left-hand edge EL corresponds to a second edge of the present disclosure. The lower edge ED corresponds to a third edge of the present disclosure. The substrate 140 may be a non-semiconductor substrate formed of, for example, a PCB (printed circuit board) or LTCC (low temperature co-fired ceramic) or may be a semiconductor chip (semiconductor substrate).

In the radio-frequency module 100M, the input terminal T1 corresponding to the transmission signal TXIN1 and the input terminal T2 corresponding to the transmission signal TXIN2 are provided adjacent to the left-hand edge EL. The input terminals T1 and T2 are positioned in proximity to each other near the left-hand edge EL. The input terminal T1 corresponds to a first input terminal of the present disclosure. The input terminal T2 corresponds to a second input terminal of the present disclosure. Note that the input terminal T1 may be provided on the back side of the substrate 140 at a position opposite to the position of the region 110 provided on the main surface. The input terminal T2 may be provided on the back side of the substrate 140 at a position opposite to the position of the region 120 provided on the main surface.

Unlike in the radio-frequency module 20M (see FIG. 3), the output terminal R1 corresponding to the reception signal RXOUT1 and the output terminal R2 corresponding to the reception signal RXOUT2 are provided adjacent to the lower edge ED. The output terminals R1 and R2 are positioned in proximity to each other near the lower edge ED. The output terminal R1 corresponds to a first output terminal of the present disclosure. The output terminal R2 corresponds to a second output terminal of the present disclosure. Note that the output terminals R1 and R2 may be provided on the back side of the substrate 140 at positions opposite to the position of the region 210 provided on the main surface.

The antenna terminals A1 and A2 electrically connected to the antennas not illustrated are provided adjacent to the right-hand edge ER. The antenna terminals A1 and A2 are positioned in proximity to each other near the right-hand edge ER.

In this embodiment, the input terminals T1 and T2 are provided adjacent to the left-hand edge EL that is opposite to the right-hand edge ER adjacent to which the antenna terminals A1 and A2 are provided. A transmitting circuit that is required to attain a high gain and a high output may oscillate when isolation between the input and the output is low and may abnormally operate. Therefore, to provide added isolation, the input terminals T1 and T2 are provided adjacent to the left-hand edge EL that is opposite to the right-hand edge ER adjacent to which the antenna terminals A1 and A2 are provided. The output terminals R1 and R2 are provided adjacent to the lower edge ED, which is one of the remaining edges adjacent to which the input terminals T1 and T2 and the antenna terminals A1 and A2 are not provided. That is, in the radio-frequency module 100M, terminals corresponding to signals of the same type are disposed together.

As illustrated in FIG. 6, when terminals corresponding to signals of the same type are disposed together in proximity to each other, wiring lines can be laid without the paths shown in dashed lines crossing each other. That is, as illustrated in FIG. 6, paths 201a and 202a, which are transmission paths, and paths 301b and 302b, which are reception paths, do not cross each other. This facilitates design work for the radio-frequency module 100M. This can facilitate improvement of the characteristics of a high-frequency band for which a path loss is relatively large and characteristics improvement is difficult, and reduction in the number of mounted components in the entire module, which makes the module small.

Second Embodiment

As in the radio-frequency module 100M of the first embodiment, a switch, when provided, causes a loss. It is desirable to reduce the effect of this loss. In a second embodiment, the effect of loss is reduced. For this, the level difference between transmission/reception signals handled by the low-band unit 100L in which a switch is provided and transmission/reception signals handled by the high-band unit 100H in which a switch is not provided is decreased as much as possible. Conditions for decreasing the level difference will be described below.

First, an Lch frequency that is a low channel handled by the low-band unit 100L including the switch 51 illustrated in FIG. 5 is denoted by $F_{LL}$ and an Hch frequency that is a high channel handled by the low-band unit 100L is denoted by $F_{LH}$. An Lch frequency that is a low channel handled by the high-band unit 100H including no switch is denoted by $F_{HL}$ and an Hch frequency that is a high channel handled by the high-band unit 100H is denoted by $F_{HH}$.

Figure 7:
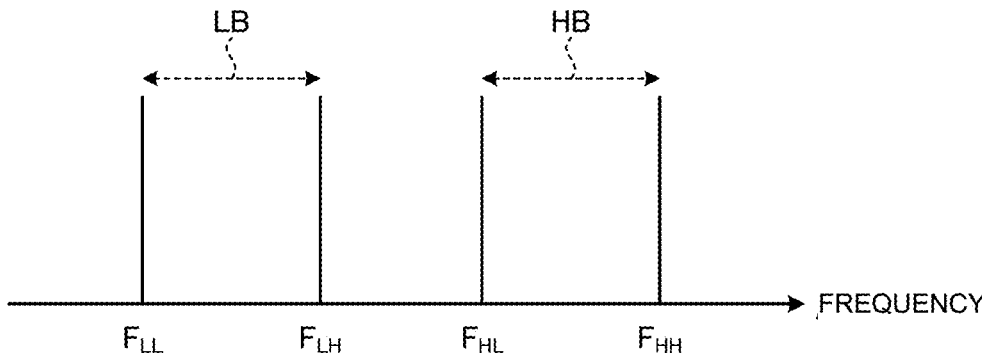
FIG. 7 is a diagram illustrating a relationship between frequencies in the radio-frequency module.

FIG. 7 is a diagram illustrating a relationship between frequencies in the radio-frequency module. In FIG. 7, the horizontal axis represents frequencies, and frequencies are high on the right side of FIG. 7 than those on the left side of FIG. 7. That is, as illustrated in FIG. 7, frequencies in a high band HB are higher than those in a low band LB. The Lch frequency of the low band LB is $F_{LL}$ and the Hch frequency thereof is $F_{LH}$. The Lch frequency of the high band HB is $F_{HL}$ and the Hch frequency thereof is $F_{HH}$.

In general, the GB product (gain×frequency) of transistors used in power amplifiers and low-noise amplifiers is constant, and the gain is inversely proportional to the frequency. Accordingly, when equivalent transistors are used, the maximum gain characteristics of the Lch band and the Hch band are −20 log $10(F_{LH}/F_{HL})$ [dB] at the minimum and −20 log $10$ $(F_{LL}/F_{HH})$ [dB] at the maximum. When a loss of a radio-frequency signal at the switch 51 is denoted by $SW_{loss}$ and the frequencies $F_{LL}$, $F_{LH}$, $F_{HL}$, and $F_{HH}$ are set so as to satisfy expression (1) below, the frequency characteristics of Lch/Hch can be designed so as to be comparable to each other.

$$-20 \log 10(F_{LH}/F_{HL}) \text{ [dB]} \leq SW_{loss} \leq -20 \log 10(F_{LL}/F_{HH}) \text{ [dB]} \qquad (1)$$

Figure 8:
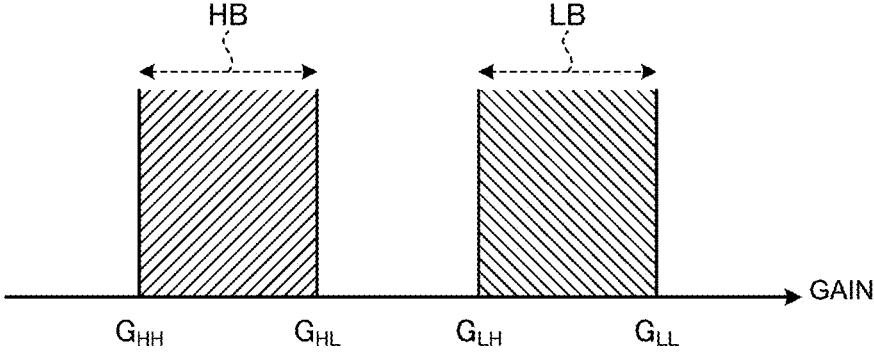
FIG. 8 is a diagram illustrating a relationship between the gains for channels of a low band and a high band.
Figure 9:
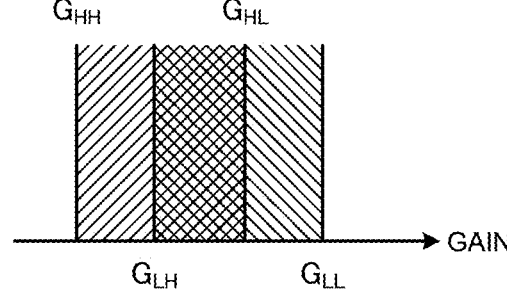
FIG. 9 is a diagram illustrating a relationship between the gains for channels of the low band and the high band.

FIG. 8 to FIG. 11 are diagrams illustrating relationships between the gains for channels of the low band LB and the high band HB. As illustrated in FIG. 8, the gain for the frequency $F_{LL}$ is denoted by $G_{LL}$, the gain for the frequency $F_{LH}$ is denoted by $G_{LH}$, the gain for the frequency $F_{HL}$ is denoted by $G_{HL}$, and the gain for the frequency $F_{HH}$ is denoted by $G_{HH}$. When expression (1) above is satisfied, the characteristics overlap in a part as illustrated in FIG. 9. Therefore, equivalent characteristics are likely to be obtained for the low band LB and the high band HB.

Figure 10:
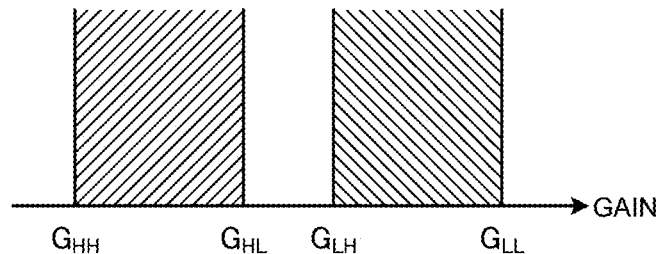
FIG. 10 is a diagram illustrating a relationship between the gains for channels of the low band and the high band.
Figure 11:
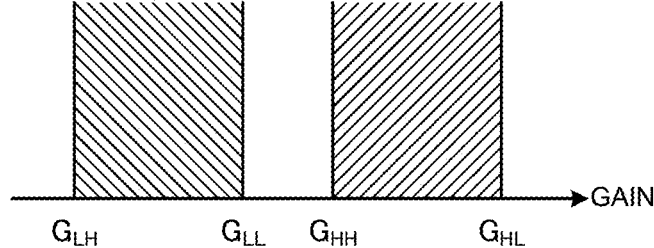
FIG. 11 is a diagram illustrating a relationship between the gains for channels of the low band and the high band.

In contrast, when $SW_{loss}<-20 \log 10 (F_{LH}/F_{HL})$ [dB] holds, the characteristics are different to a large degree and an overlapping part is not present in the bands as illustrated in FIG. 10. Accordingly, equivalent characteristics are not obtained for the low band LB and the high band HB. When $SW_{loss}>-20 \log 10(F_{LL}/F_{HH})$ [dB] holds, the characteristics of Hch and the characteristics of Lch are flipped to a large degree as illustrated in FIG. 11. Accordingly, equivalent characteristics are not obtained for the low band LB and the high band HB.

When the relationship expressed by expression (1) above is satisfied, the loss $SW_{loss}$ of a radio-frequency signal at the switch 51 can be reduced, and the characteristics of the module can be improved.

Third Embodiment

A radio-frequency signal transmitting/receiving circuit mounted in a radio-frequency module according to a third embodiment includes a larger number of paths than in the first embodiment in order to achieve high reception sensitivity by MIMO (multiple-input and multiple-output) reception. In the third embodiment, a configuration in which two reception paths are provided per transmission path is employed.

Figure 12:
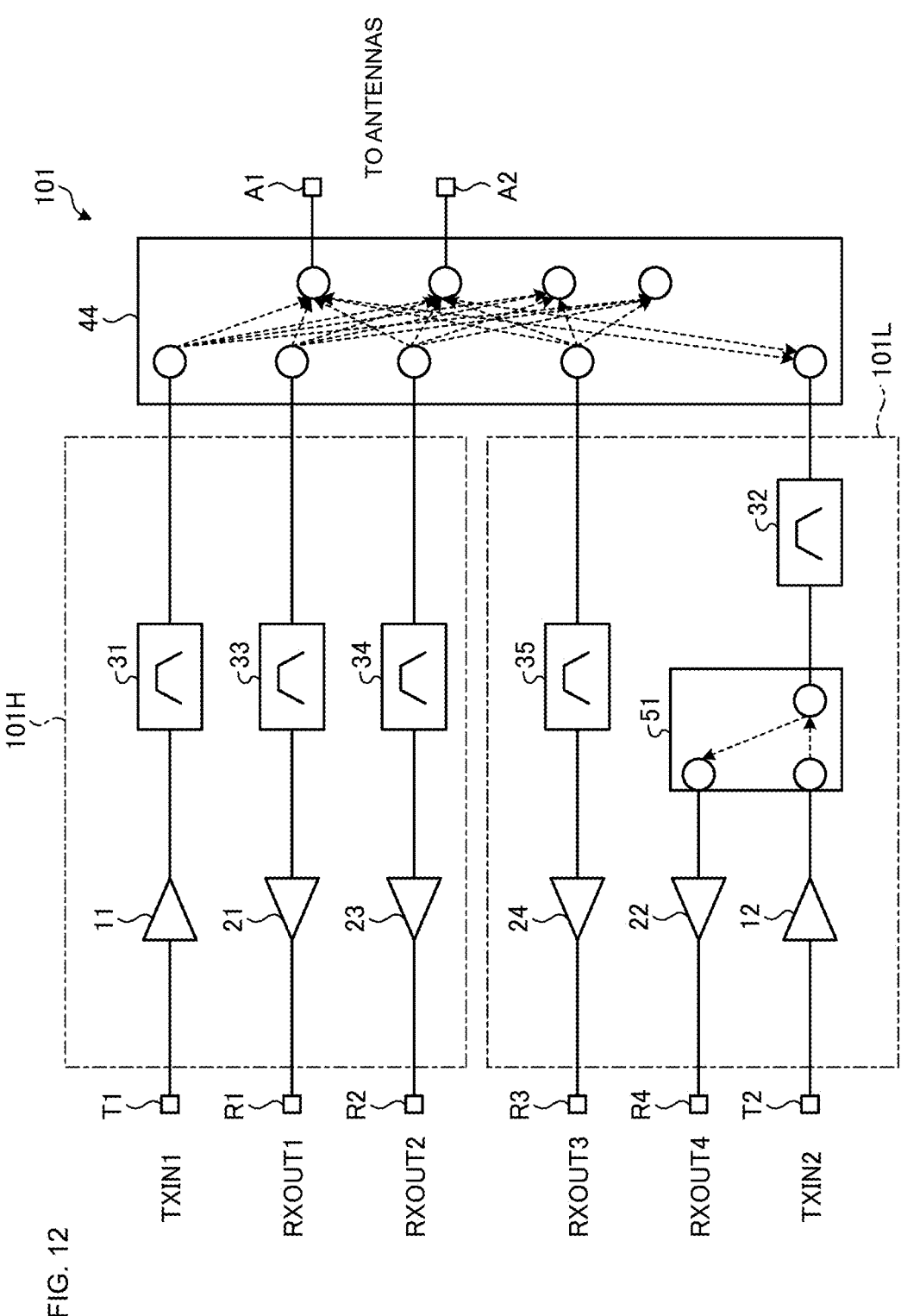
FIG. 12 is a diagram illustrating a radio-frequency signal transmitting/receiving circuit mounted in a radio-frequency module according to a third embodiment of the present disclosure.

FIG. 12 is a diagram illustrating a radio-frequency signal transmitting/receiving circuit 101 mounted in a radio-frequency module according to the third embodiment of the present disclosure. As illustrated in FIG. 12, the radio-frequency signal transmitting/receiving circuit 101 has a configuration that is obtained by adding the filters 34 and 35 and low-noise amplifiers 23 and 24 to the radio-frequency signal transmitting/receiving circuit 100 described with reference to FIG. 5 and that allows switching by a switch 44. In the radio-frequency signal transmitting/receiving circuit 101, the filter 34 and the low-noise amplifier 23 constitute a part of a high-band unit 101H. The filter 35 and the low-noise amplifier 24 constitute a part of a low-band unit 101L.

The radio-frequency signal transmitting/receiving circuit 101 illustrated in FIG. 12 transmits the transmission signals TXIN1 and TXIN2 upon transmission. In the radio-frequency signal transmitting/receiving circuit 101, the transmission signal TXIN1 is input to the input terminal T1, passes through the power amplifier 11, the filter 31, the switch 44, and the antenna terminal A1, and is output from an antenna not illustrated. The transmission signal TXIN2 is input to the input terminal T2, passes through the power amplifier 12, the switch 51, the filter 32, the switch 44, and the antenna terminal A2, and is output from an antenna not illustrated.

The radio-frequency signal transmitting/receiving circuit 101 receives the reception signals RXOUT1 to RXOUT4 upon reception. In the radio-frequency signal transmitting/receiving circuit 101, the reception signal RXOUT1 from an antenna not illustrated passes through the switch 44, the filter 33, and the low-noise amplifier 21 and is output from the output terminal R1. The reception signal RXOUT2 from an antenna not illustrated passes through the switch 44, the filter 34, and the low-noise amplifier 23 and is output from the output terminal R2. The reception signal RXOUT3 from an antenna not illustrated passes through the switch 44, the filter 35, and the low-noise amplifier 24 and is output from an output terminal R3. The reception signal RXOUT4 from an antenna not illustrated passes through the switch 44, the filter 32, the switch 51, and the low-noise amplifier 22 and is output from an output terminal R4.

Figure 13:
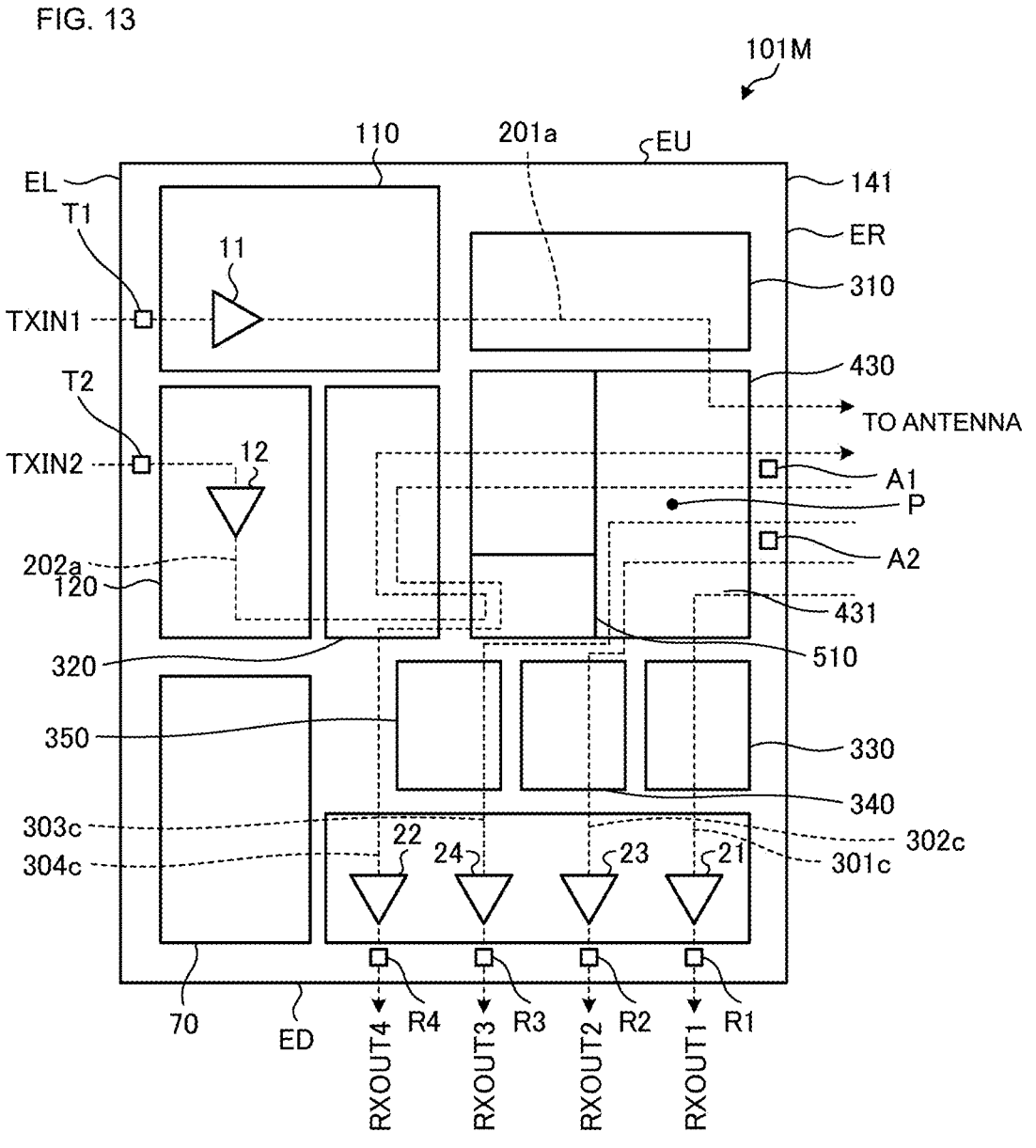
FIG. 13 is a diagram illustrating an example arrangement of the radio-frequency module for realizing the radio-frequency signal transmitting/receiving circuit illustrated in FIG. 12.

FIG. 13 is a diagram illustrating an example arrangement of a radio-frequency module 101M for realizing the radio-frequency signal transmitting/receiving circuit 101 illustrated in FIG. 12. In FIG. 13, the radio-frequency module 101M has the regions 110, 120, 310, 320, and 430 provided on a substrate 141 as in the radio-frequency module 100M (see FIG. 6). The radio-frequency module 101M further has regions 340 and 350. In the region 340, the filter 34 is included. In the region 350, the filter 35 is included. In the region 210, the low-noise amplifiers 21, 22, 23, and 24 are included. The region 430 includes the region 431 and the region 510. In the region 431, the switch 44 illustrated in FIG. 12 is included. The antenna terminals A1 and A2 electrically connected to antennas not illustrated are provided in proximity to the region 431 and in proximity to the right-hand edge ER. The antenna terminal A1 corresponds to the first antenna terminal of the present disclosure. The antenna terminal A2 corresponds to the second antenna terminal of the present disclosure.

In the region 431, electrode pads (not illustrated) electrically connected to the antenna terminals A1 and A2 respectively are included. Preferably, these electrode pads are provided in the region 431 in proximity to the antenna terminals A1 and A2. Preferably, the electrode pads are provided at positions closer to the antenna terminals A1 and A2 than the center P of the region 430.

In the region 510, the switch 51 (as illustrated in FIG. 5 and FIG. 12) is provided. The switch 51 in the region 510 allows an output from the filter 32 in the region 320 to be input to the low-noise amplifier 22 upon reception in time division duplex communication. The switch 51 allows an output from the power amplifier 12 to be input to the filter 32 in the region 320 upon transmission in time division duplex communication.

In the region 510, electrode pads (not illustrated) electrically connected to the input terminal T2 and the output terminal R4 respectively are included. Preferably, these electrode pads are provided in the region 510 at positions as close to the input terminal T2 and the output terminal R4 as possible. With the arrangement as described above, wiring lines can be laid without the paths shown in dashed lines in FIG. 13 crossing each other.

The substrate 141 corresponds to the substrate of the present disclosure. The main surface of the substrate 141 has four edges. The main surface of the substrate 141 has the upper edge EU, the lower edge ED, the left-hand edge EL, and the right-hand edge ER. The upper edge EU and the lower edge ED are at positions opposite to each other. The left-hand edge EL and the right-hand edge ER are at positions opposite to each other. The right-hand edge ER corresponds to the first edge of the present disclosure. The left-hand edge EL corresponds to the second edge of the present disclosure. The lower edge ED corresponds to the third edge of the present disclosure. The substrate 141 may be a non-semiconductor substrate formed of, for example, a PCB or LTCC or may be a semiconductor chip (semiconductor substrate).

In the radio-frequency module 101M, as in the radio-frequency module 100M (see FIG. 6), the input terminal T1 corresponding to the transmission signal TXIN1 and the input terminal T2 corresponding to the transmission signal TXIN2 are provided adjacent to the left-hand edge EL. The input terminals T1 and T2 are positioned in proximity to each other near the left-hand edge EL. The output terminal R1 corresponding to the reception signal RXOUT1, the output terminal R2 corresponding to the reception signal RXOUT2, the output terminal R3 corresponding to the reception signal RXOUT3, and the output terminal R4 corresponding to the reception signal RXOUT4 are provided adjacent to the lower edge ED. The output terminals R1, R2, R3, and R4 are positioned in proximity to each other near the lower edge ED. The antenna terminals A1 and A2 electrically connected to the antennas not illustrated are provided adjacent to the right-hand edge ER. The antenna terminals A1 and A2 are positioned in proximity to each other near the right-hand edge ER. That is, in the radio-frequency module 101M, terminals corresponding to signals of the same type are disposed together.

As illustrated in FIG. 13, when terminals corresponding to signals of the same type are disposed together in proximity to each other, wiring lines can be laid without paths crossing each other. That is, as illustrated in FIG. 13, the paths 201*a* and 202*a*, which are transmission paths, and paths 301*c*, 302*c*, 303*c*, and 304*c*, which are reception paths, do not cross each other. This facilitates design work for the radio-frequency module 101M. This can facilitate improvement of the characteristics of a high-frequency band for which a path loss is relatively large and characteristics improvement is difficult, and reduction in the number of mounted components in the entire module, which makes the module small.

Modification

Although a radio-frequency module employing two bands including a high band and a low band has been described above, three or more bands may be employed in the radio-frequency module. In this case, a switch is provided for a band, among the three or more bands, for which a loss caused by the switch, when provided, is small to perform switching, thereby allowing a filter to be shared. Accordingly, an increase in the circuit size can be reduced and a plurality of bands corresponding to time division multiplex communication can be realized.

REFERENCE SIGNS LIST

10, 20, 100, 101 radio-frequency signal transmitting/receiving circuit
11, 12 power amplifier
20M, 20Ma, 100M radio-frequency module
21, 22, 23, 24 low-noise amplifier
31, 32, 33, 34, 35 filter
41, 42, 43, 44, 51, 52 switch
70, 110, 120, 140, 141, 210, 310, 320, 330, 340, 350, 420, 430, 431, 510, 520 region
A1, A2 antenna terminal
R1, R2, R3, R4 output terminal
T1, T2 input terminal

The invention claimed is:
1. A radio-frequency module comprising:
a substrate on which the following are mounted a first input terminal to which a first transmission signal in a first frequency band is input;

a second input terminal to which a second transmission signal in a second frequency band lower than the first frequency band is input;

a first transmission amplifier that amplifies the first transmission signal input to the first input terminal;

a first filter that allows an output from the first transmission amplifier to pass therethrough;

a second filter that allows a first reception signal in the first frequency band to pass therethrough;

a third filter that allows a second reception signal in the second frequency band and the second transmission signal in the second frequency band to pass therethrough;

a first reception amplifier that amplifies an output from the second filter;

a second reception amplifier that amplifies an output from the third filter;

a second transmission amplifier that amplifies the second transmission signal input to the second input terminal;

a first switch and a second switch;

a first output terminal from which an output from the first reception amplifier is output; and a second output terminal from which an output from the second reception amplifier is output, wherein upon transmission in time division duplex communication, the radio-frequency module transmits at least one of the first transmission signal or the second transmission signal, upon reception in time division duplex communication, the radio-frequency module receives at least one of the first reception signal or the second reception signal, the first switch allows the output from the third filter to be input to the second reception amplifier upon reception in time division duplex communication, and allows an output from the second transmission amplifier to be input to the third filter upon transmission in time division duplex communication, the second switch is in at least one of a state in which the second switch allows a reception signal from a first antenna to be input to the first reception amplifier via the second filter or a state in which the second switch allows a reception signal from a second antenna to be input to the second reception amplifier via the third filter upon reception in time division duplex communication, and is in at least one of a state in which the second switch allows an output from the first filter to be output to the first antenna or a state in which the second switch allows an output from the third filter to be output to the second antenna upon transmission in time division duplex communication, the first antenna and the second antenna are connected to a first antenna terminal and a second antenna terminal that are provided on the substrate in proximity to each other, the first input terminal and the second input terminal are provided on the substrate in proximity to each other, the first output terminal and the second output terminal are provided on the substrate in proximity to each other, the substrate has a main surface on which the first input terminal, the second input terminal, the first antenna terminal, the second antenna terminal, the first output terminal, and the second output terminal are mounted, the main surface has a first edge, a second edge, and a third edge that connects the first edge with the second edge, the first antenna terminal and the second antenna terminal are provided adjacent to the first edge, the first input terminal and the second input terminal are provided adjacent to the second edge, and the first output terminal and the second output terminal are provided adjacent to the third edge.

2. The radio-frequency module according to claim 1, wherein the first edge and the second edge are opposite to each other on the main surface.

3. The radio-frequency module according to claim 2, wherein the main surface of the substrate has the first edge, the second edge, and the third edge, the first antenna terminal and the second antenna terminal are provided in proximity to the first edge, the first input terminal and the second input terminal are provided in proximity to the second edge, and the first output terminal and the second output terminal are provided in proximity to the third edge.

4. The radio-frequency module according to claim 3, wherein when a loss in a radio-frequency band caused by the first switch is denoted by $SW_{loss}$, a frequency at a lower limit of the first frequency band is denoted by $F_{LL}$, a frequency at an upper limit of the first frequency band is denoted by $F_{LH}$, a frequency at a lower limit of the second frequency band is denoted by $F_{HL}$, and a frequency at an upper limit of the second frequency band is denoted by $F_{HH}$, $SW_{loss}$, $F_{LL}$, $F_{LH}$, $F_{HL}$, and $F_{HH}$ have a relationship of $$-20 \log 10(F_{LH}/F_{HL}) \text{ [dB]} \leq SW_{loss} \leq -20 \log 10(F_{LL}/F_{HH}) \text{ [dB]}.$$

5. The radio-frequency module according to claim 1, wherein the main surface of the substrate has the first edge, the second edge, and the third edge, the first antenna terminal and the second antenna terminal are provided in proximity to the first edge, the first input terminal and the second input terminal are provided in proximity to the second edge, and the first output terminal and the second output terminal are provided in proximity to the third edge.

6. A radio-frequency module comprising:

a substrate on which the following are mounted a first input terminal to which a first transmission signal in a first frequency band is input:

a second input terminal to which a second transmission signal in a second frequency band lower than the first frequency band is input;

a first transmission amplifier that amplifies the first transmission signal input to the first input terminal;

a first filter that allows an output from the first transmission amplifier to pass therethrough;

a second filter that allows a first reception signal in the first frequency band to pass therethrough;

a third filter that allows a second reception signal in the second frequency band and the second transmission signal in the second frequency band to pass therethrough;

a first reception amplifier that amplifies an output from the second filter;

a second reception amplifier that amplifies an output from the third filter;

a second transmission amplifier that amplifies the second transmission signal input to the second input terminal;

a first switch and a second switch;

a first output terminal from which an output from the first reception amplifier is output; and a second output terminal from which an output from the second reception amplifier is output, wherein upon transmission in time division duplex communication, the radio-frequency module transmits at least one of the first transmission signal or the second transmission signal, upon reception in time division duplex communication, the radio-frequency module receives at least one of the first reception signal or the second reception signal, the first switch allows the output from the third filter to be input to the second reception amplifier upon reception in time division duplex communication, and allows an output from the second transmission amplifier to be input to the third filter upon transmission in time division duplex communication, the second switch is in at least one of a state in which the second switch allows a reception signal from a first antenna to be input to the first reception amplifier via the second filter or a state in which the second switch allows a reception signal from a second antenna to be input to the second reception amplifier via the third filter upon reception in time division duplex communication, and is in at least one of a state in which the second switch allows an output from the first filter to be output to the first antenna or a state in which the second switch allows an output from the third filter to be output to the second antenna upon transmission in time division duplex communication, wherein the substrate has a main surface on which the first input terminal, the second input terminal, the first antenna terminal, the second antenna terminal, the first output terminal, and the second output terminal are mounted, the main surface has a first edge, a second edge, and a third edge that connects the first edge with the second edge, the first antenna terminal and the second antenna terminal are provided adjacent to the first edge, the first input terminal and the second input terminal are provided adjacent to the second edge, and the first output terminal and the second output terminal are provided adjacent to the third edge.

7. The radio-frequency module according to claim 6, wherein the first edge and the second edge are opposite to each other on the main surface.

8. The radio-frequency module according to claim 7, wherein the main surface of the substrate has the first edge, the second edge, and the third edge, the first antenna terminal and the second antenna terminal are provided in proximity to the first edge, the first input terminal and the second input terminal are provided in proximity to the second edge, and the first output terminal and the second output terminal are provided in proximity to the third edge.

9. The radio-frequency module according to claim 8, wherein when a loss in a radio-frequency band caused by the first switch is denoted by $SW_{loss}$, a frequency at a lower limit of the first frequency band is denoted by $F_{LL}$, a frequency at an upper limit of the first frequency band is denoted by $F_{LH}$, a frequency at a lower limit of the second frequency band is denoted by $F_{HL}$, and a frequency at an upper limit of the second frequency band is denoted by $F_{HH}$, $SW_{loss}$, $F_{LL}$, $F_{LH}$, $F_{HL}$, and $F_{HH}$ have a relationship of $$-20 \log 10(F_{LH}/F_{HL}) \, [dB] \leq SW_{loss} \leq -20 \log 10(F_{LL}/F_{HH}) \, [dB].$$

10. The radio-frequency module according to claim 1, wherein when a loss in a radio-frequency band caused by the first switch is denoted by $SW_{loss}$, a frequency at a lower limit of the first frequency band is denoted by $F_{LL}$, a frequency at an upper limit of the first frequency band is denoted by $F_{LH}$, a frequency at a lower limit of the second frequency band is denoted by $F_{HL}$, and a frequency at an upper limit of the second frequency band is denoted by $F_{HH}$, $SW_{loss}$, $F_{LL}$, $F_{LH}$, $F_{HL}$, and $F_{HH}$ have a relationship of $$-20 \log 10(F_{LH}/F_{HL}) \, [dB] \leq SW_{loss} \leq -20 \log 10(F_{LL}/F_{HH}) \, [dB].$$

11. The radio-frequency module according to claim 2, wherein when a loss in a radio-frequency band caused by the first switch is denoted by $SW_{loss}$, a frequency at a lower limit of the first frequency band is denoted by $F_{LL}$, a frequency at an upper limit of the first frequency band is denoted by $F_{LH}$, a frequency at a lower limit of the second frequency band is denoted by $F_{HL}$, and a frequency at an upper limit of the second frequency band is denoted by $F_{HH}$, $SW_{loss}$, $F_{LL}$, $F_{LH}$, $F_{HL}$, and Fan have a relationship of $$-20 \log 10(F_{LH}/F_{HL}) \, [dB] \leq SW_{loss} \leq -20 \log 10(F_{LL}/F_{HH}) \, [dB].$$

12. The radio-frequency module according to claim 5, wherein when a loss in a radio-frequency band caused by the first switch is denoted by $SW_{loss}$, a frequency at a lower limit of the first frequency band is denoted by $F_{LL}$, a frequency at an upper limit of the first frequency band is denoted by $F_{LH}$, a frequency at a lower limit of the second frequency band is denoted by $F_{HL}$, and a frequency at an upper limit of the second frequency band is denoted by $F_{HH}$, $SW_{loss}$, $F_{LL}$, $F_{LH}$, $F_{HL}$, and $F_{HH}$ have a relationship of $$-20 \log 10(F_{LH}/F_{HL}) \, [dB] \leq SW_{loss} \leq -20 \log 10(F_{LL}/F_{HH}) \, [dB].$$

13. The radio-frequency module according to claim 6, wherein when a loss in a radio-frequency band caused by the first switch is denoted by $SW_{loss}$, a frequency at a lower limit of the first frequency band is denoted by $F_{LL}$, a frequency at an upper limit of the first frequency band is denoted by $F_{LH}$, a frequency at a lower limit of the second frequency band is denoted by $F_{HL}$, and a frequency at an upper limit of the second frequency band is denoted by $F_{HH}$, $SW_{loss}$, $F_{LL}$, $F_{LH}$, $F_{HL}$, and $F_{HH}$ have a relationship of $$-20 \log 10(F_{LH}/F_{HL}) \, [dB] \leq SW_{loss} \leq -20 \log 10(F_{LL}/F_{HH}) \, [dB].$$

14. The radio-frequency module according to claim 7, wherein when a loss in a radio-frequency band caused by the first switch is denoted by $SW_{loss}$, a frequency at a lower limit of the first frequency band is denoted by $F_{LL}$, a frequency at an upper limit of the first frequency band is denoted by $F_{LH}$, a frequency at a lower limit of the second frequency band is denoted by $F_{HL}$, and a frequency at an upper limit of the second frequency band is denoted by $F_{HH}$, $SW_{loss}$, $F_{LL}$, $F_{LH}$, $F_{HL}$, and $F_{HH}$ have a relationship of $$-20 \log 10(F_{LH}/F_{HL}) \, [dB] \leq SW_{loss} \leq -20 \log 10(F_{LL}/F_{HH}) \, [dB].$$

15. The radio-frequency module according to claim 1, further comprising a third reception amplifier and a fourth reception amplifier, wherein the radio-frequency module performs multiple-input and multiple-output (MIMO) reception.

16. The radio-frequency module according to claim 1, wherein electrode pads electrically connected to the first antenna terminal and the second antenna terminal are provided at positions closer to the antenna terminals than a center of a region in which the second switch is disposed.

17. The radio-frequency module according to claim 1, further comprising a power amplifier controller mounted on the substrate, the power amplifier controller configured to control the first transmission amplifier and the second transmission amplifier.

18. The radio-frequency module according to claim 6, further comprising a third reception amplifier and a fourth reception amplifier, wherein the radio-frequency module performs multiple-input and multiple-output (MIMO) reception.

19. The radio-frequency module according to claim 6, wherein electrode pads electrically connected to the first antenna terminal and the second antenna terminal are provided at positions closer to the antenna terminals than a center of a region in which the second switch is disposed.

20. The radio-frequency module according to claim 6, further comprising a power amplifier controller mounted on the substrate, the power amplifier controller configured to control the first transmission amplifier and the second transmission amplifier.

21. The radio-frequency module according to claim 6, wherein the first edge and the second edge are opposite to each other, and the third edge is perpendicular to the first edge and the second edge to provide electromagnetic isolation between the transmission signals at the second edge and the reception signals at the third edge.

\* \* \* \* \*